(12) United States Patent
Yang et al.

(10) Patent No.: US 12,464,832 B2
(45) Date of Patent: Nov. 4, 2025

(54) PHOTOVOLTAIC MODULE

(71) Applicant: Longi Solar Technology (Jia Xing) Co., Ltd., Zhejiang (CN)

(72) Inventors: Qian Yang, Zhejiang (CN); Qifu Guo, Zhejiang (CN); Yongzhi Xu, Zhejiang (CN); Mingmin Shui, Zhejiang (CN); Aijun Liu, Zhejiang (CN); Feng Zhang, Zhejiang (CN)

(73) Assignee: Longi solar technology (Jia Xing) Co., Ltd., Jiaxing (CN)

( * ) Notice: Subject to any disclaimer, the term of this patent is extended or adjusted under 35 U.S.C. 154(b) by 0 days.

(21) Appl. No.: 19/007,880

(22) Filed: Jan. 2, 2025

(65) Prior Publication Data

US 2025/0275260 A1    Aug. 28, 2025

Related U.S. Application Data

(63) Continuation of application No. PCT/CN2024/127125, filed on Oct. 24, 2024.

(30) Foreign Application Priority Data

Feb. 27, 2024  (CN) .................. 202410217992.7

(51) Int. Cl.
*H10F 19/90* (2025.01)
*H10F 77/00* (2025.01)
*H10F 77/20* (2025.01)

(52) U.S. Cl.
CPC ......... *H10F 19/908* (2025.01); *H10F 77/219* (2025.01); *H10F 77/935* (2025.01)

(58) Field of Classification Search
CPC ..... H10F 77/219; H10F 77/935; H10F 19/908
See application file for complete search history.

(56) References Cited

U.S. PATENT DOCUMENTS

| 10,879,411 B2 | 12/2020 | Oh et al. |
| 2007/0095384 A1* | 5/2007 | Farquhar ............... H10F 77/219 |
| | | 136/244 |

(Continued)

FOREIGN PATENT DOCUMENTS

| CN | 107871788 A | 4/2018 |
| CN | 110137282 A | 8/2019 |

(Continued)

OTHER PUBLICATIONS

Office Action in Australian Appln. No. 2024278199, dated Jan. 31, 2025, 7 pages.

(Continued)

*Primary Examiner* — Mayla Gonzalez Ramos
(74) *Attorney, Agent, or Firm* — Fish & Richardson P.C.

(57) ABSTRACT

This application provides a photovoltaic module, and relates to the field of photovoltaic technologies. The photovoltaic module includes a conductive interconnection member. The conductive interconnection member is electrically connected to front electrode pads of a first solar cell and back electrode pads of a second solar cell adjacent to the first solar cell. A distance between a first solar cell edge and the front electrode pad adjacent to the first solar cell edge is D1, a distance between a second solar cell edge and the front electrode pad adjacent to the second solar cell edge is D3, a distance between a fourth solar cell edge and the back electrode pad adjacent to the fourth solar cell edge is D2, a distance between a third solar cell edge and the back electrode pad adjacent to the third solar cell edge is D4. A sum of D1 and D2 is greater than a sum of D3 and D4.

21 Claims, 5 Drawing Sheets

(56) References Cited

U.S. PATENT DOCUMENTS

| | | | | |
|---|---|---|---|---|
| 2010/0000602 | A1* | 1/2010 | Gray | H10F 77/215 |
| | | | | 438/98 |
| 2016/0322527 | A1* | 11/2016 | Hwang | H10F 10/14 |
| 2018/0158970 | A1* | 6/2018 | Yoon | H10K 30/87 |
| 2023/0253515 | A1* | 8/2023 | Guan | H10F 77/215 |
| | | | | 136/256 |
| 2024/0136455 | A1* | 4/2024 | Guo | H10F 77/219 |

FOREIGN PATENT DOCUMENTS

| | | |
|---|---|---|
| CN | 209729932 U | 12/2019 |
| CN | 214505504 U | 10/2021 |
| CN | 214505519 U | 10/2021 |
| CN | 215184017 U | 12/2021 |
| CN | 215342623 U | 12/2021 |
| CN | 114823988 A | 7/2022 |
| CN | 115172502 A | 10/2022 |
| CN | 218730997 U | 3/2023 |
| CN | 218769571 U | 3/2023 |
| CN | 219144188 U | 6/2023 |
| CN | 118263348 B | 9/2024 |
| DE | 202023104947 U1 | 10/2023 |
| NL | 2035736 A | 3/2024 |
| WO | WO 2020168380 A1 | 8/2020 |

OTHER PUBLICATIONS

Notification of Invalidation Request in Chinese Appln. No. 202410217992.7, dated Jun. 4, 2025, 134 pages (with machine translation).

* cited by examiner

PHOTOVOLTAIC MODULE

CROSS-REFERENCE TO RELATED APPLICATIONS

This application is a continuation of PCT Application No. PCT/CN2024/127125, filed on Oct. 24, 2024, which claims priority to Chinese Patent Application No. 202410217992.7, filed on Feb. 27, 2024, which is incorporated herein by reference in its entirety. The disclosures of the aforementioned applications are hereby incorporated by reference in their entireties.

TECHNICAL FIELD

This application relates to the field of photovoltaic technologies, and in particular, to a photovoltaic module.

BACKGROUND

Solar cells can convert solar energy into electric energy, and have a broad application prospect because they utilize clean energy.

Because the voltage outputted by a single solar cell is low, a number of solar cells are generally connected in series to form a cell string, to expand the range of application scenarios. However, existing photovoltaic modules have issues such as high prices and subpar performance.

SUMMARY

This application provides a photovoltaic module, and aims to resolve the problems of high costs and poor performance of cell strings in existing photovoltaic modules.

A photovoltaic module is provided, the photovoltaic module including one or more cell strings;

the cell string including at least one series-connected unit; and the series-connected unit including at least one conductive interconnection member, and a first solar cell and a second solar cell adjacent to each other in an extending direction of the conductive interconnection member, where the first solar cell and the second solar cell each include a solar cell body and an electrode structure, where the solar cell body includes two solar cell edges opposite to each other, and a first surface and a second surface opposite to each other; the electrode structure includes a plurality of front electrode pads and a plurality of back electrode pads, the plurality of front electrode pads are located on the first surface, and the plurality of back electrode pads are located on the second surface; and the conductive interconnection member is electrically connected to the front electrode pads of the first solar cell and the back electrode pads of the second solar cell, and in the extending direction of the conductive interconnection member, a first solar cell edge and a second solar cell edge of the first solar cell and a third solar cell edge and a fourth solar cell edge of the second solar cell are arranged sequentially, where in the extending direction of the conductive interconnection member:

a distance between the first solar cell edge and the front electrode pad adjacent to the first solar cell edge is defined as $D1$, a distance between the second solar cell edge and the front electrode pad adjacent to the second solar cell edge is defined as $D3$, a distance between the fourth solar cell edge and the back electrode pad adjacent to the fourth solar cell edge is defined as $D2$, a distance between the third solar cell edge and the back electrode pad adjacent to the third solar cell edge is defined as $D4$, and a sum of $D1$ and $D2$ is greater than a sum of $D3$ and $D4$.

In this application, in the series-connected unit, the conductive interconnection member is electrically connected to the front electrode pads of the first solar cell and the back electrode pads of the second solar cell. In this way, in the extending direction of a conductive interconnection member, the conductive interconnection member mainly extends and covers the front electrode pad adjacent to the first solar cell edge, the second solar cell edge, the third solar cell edge, and the back electrode pad adjacent to the fourth solar cell edge. An edge of the front electrode pad adjacent to the first solar cell edge is approximately a start bonding point of the conductive interconnection member, and an edge of the back electrode pad adjacent to the fourth solar cell edge is approximately an end bonding point of the conductive interconnection member. In other words, in the extending direction of the conductive interconnection member, the conductive interconnection member mainly needs to cover a length obtained by subtracting the distance $D1$ between the first solar cell edge and the front electrode pad adjacent to the first solar cell edge and the distance $D2$ between the fourth solar cell edge and the back electrode pad adjacent to the fourth solar cell edge from a sum of a size of the first solar cell and a size of the second solar cell. That is, the conductive interconnection member needs to pass through the distance $D3$ between the second solar cell edge and the front electrode pad adjacent to the second solar cell edge and the distance $D4$ between the third solar cell edge and the back electrode pad adjacent to the third solar cell edge; but does not need to pass through the distance $D1$ between the first solar cell edge and the front electrode pad adjacent to the first solar cell edge and the distance $D2$ between the fourth solar cell edge and the back electrode pad adjacent to the fourth solar cell edge. In this application, the sum of $D1$ and $D2$ is greater than the sum of $D3$ and $D4$, so that the start bonding point and the end bonding point are recessed inward in the extending direction of the conductive interconnection member. Specifically, in a case that the size of the solar cell is fixed, a larger sum of $D1$ and $D2$ indicates a larger sum of inward recesses of the start bonding point and the end bonding point, and a longer distance that the conductive interconnection member does not need to pass through, that is, a shorter length of the conductive interconnection member; and a larger sum of $D3$ and $D4$ indicates a longer distance that the conductive interconnection member needs to pass through, that is, a longer length of the conductive interconnection member. In this application, the sum of $D1$ and $D2$ is greater than the sum of $D3$ and $D4$, that is, the start bonding point and the end bonding point of the conductive interconnection member are recessed inward, so that the length of the conductive interconnection member is reduced, and costs are reduced. In addition, the conductive interconnection member passes through a short distance, so that a probability of twisting and warping of the conductive interconnection member at the start bonding point and the end bonding point is further reduced, and a risk of breaking and cracking is reduced.

Optionally, the first solar cell edge is a chamfered edge with a chamfered corner, and the second solar cell edge is an edge without a chamfered corner; or the first solar cell edge is an edge without a chamfered corner, and the second solar cell edge is a chamfered edge; and the third solar cell edge is a chamfered edge, and the fourth solar cell edge is an edge without a chamfered corner; or the third solar cell edge is an edge without a chamfered corner, and the fourth solar cell edge is a chamfered edge.

Optionally, a ratio of the sum of D1 and D2 to the sum of D3 and D4 is greater than 1 and less than 2.5.

Optionally, the ratio of the sum of D1 and D2 to the sum of D3 and D4 is greater than 1.5 and less than 2.

Optionally, in the extending direction of the conductive interconnection member, a first gap exists between the first solar cell and the second solar cell, where the sum of D1 and D2 is greater than a sum of D3, D4, and the first gap.

Optionally, the first gap ranges from 0.5 mm to 5 mm.

Optionally, the electrode structure further includes:
  a plurality of front fingers distributed in parallel, located on the first surface and electrically connected to the front electrode pads; and
  a plurality of back fingers distributed in parallel, located on the second surface and electrically connected to the back electrode pads, where
  a second gap exists between two adjacent front fingers, and a third gap exists between two adjacent back fingers, where
  D1 is greater than 2 times the second gap and less than 11 times the second gap; and/or
  D3 is greater than 2 times the second gap and less than 11 times the second gap; and/or
  D2 is greater than 2 times the third gap and less than 11 times the third gap; and/or
  D4 is greater than 2 times the third gap and less than 11 times the third gap.

Optionally, D1 ranges from 2 mm to 15 mm; and/or
D2 ranges from 2 mm to 15 mm; and/or
D3 ranges from 2 mm to 15 mm; and/or
D4 ranges from 2 mm to 15 mm.

Optionally, D1 is greater than D3.

Optionally, a difference between D1 and D3 ranges from 1 mm to 10 mm; and/or
  the electrode structure further includes: a plurality of front fingers distributed in parallel, located on the first surface and electrically connected to the front electrode pads, where a second gap exists between two adjacent front fingers, and the difference between D1 and D3 is greater than 1 times the second gap and less than 6 times the second gap.

Optionally, D2 is greater than D4.

Optionally, a difference between D2 and D4 ranges from 0.5 mm to 10 mm; and/or
  the electrode structure further includes: a plurality of back fingers distributed in parallel, located on the second surface and electrically connected to the back electrode pads, where a third gap exists between two adjacent back fingers, and the difference between D2 and D4 is greater than 1 times the third gap and less than 6 times the third gap.

Optionally, in the extending direction of the conductive interconnection member:
  a distance between a start bonding point of the conductive interconnection member and the first solar cell edge is defined as D5,
  a distance between an end bonding point of the conductive interconnection member and the fourth solar cell edge is defined as D6, and
  D5 is not equal to D6.

Optionally, D5 is greater than D6.

Optionally, the electrode structure further includes:
  a plurality of front fingers distributed in parallel, located on the first surface and electrically connected to the front electrode pads; and
  a plurality of back fingers distributed in parallel, located on the second surface and electrically connected to the back electrode pads, where
  a second gap exists between two adjacent front fingers, and a third gap exists between two adjacent back fingers, where
  D5 is greater than 1 times the second gap and less than 11 times the second gap; and/or
  D6 is greater than 1 times the third gap and less than 11 times the third gap; and/or
  D5 ranges from 0.5 mm to 15 mm; and/or
  D6 ranges from 0.5 mm to 15 mm.

Optionally, in the extending direction of the conductive interconnection member:
  a distance between a start bonding point of the conductive interconnection member and the front electrode pad adjacent to the first solar cell edge is defined as D7,
  a distance between an end bonding point of the conductive interconnection member and the back electrode pad adjacent to the fourth solar cell edge is defined as D8, and
  D7 is not equal to D8.

Optionally, D7 is less than D8.

Optionally, the electrode structure further includes:
  a plurality of front fingers distributed in parallel, located on the first surface and electrically connected to the front electrode pads; and
  a plurality of back fingers distributed in parallel, located on the second surface and electrically connected to the back electrode pads, where
  a second gap exists between two adjacent front fingers, and a third gap exists between two adjacent back fingers,
  where
  D7 is greater than 1 times the second gap and less than 5 times the second gap; and/or
  D8 is greater than 1 times the third gap and less than 5 times the third gap; and/or
  D7 ranges from 0 mm to 15 mm; and/or
  D8 ranges from 0 mm to 15 mm.

Optionally, in the extending direction of the conductive interconnection member, a first gap exists between the first solar cell and the second solar cell, where
  the sum of D3 and D4 is greater than 1.5 times the first gap and less than 20 times the first gap.

Optionally, a length of the solar cell body is greater than or equal to a width of the solar cell body; and the first solar cell edge, the second solar cell edge, the third solar cell edge, and the fourth solar cell edge at least include a portion intersecting with a direction of the width of the solar cell body;
and/or
  the plurality of front electrode pads are arranged in an array to form a front electrode pad array, where in the front electrode pad array, a quantity of columns ranges from 6 to 8, a quantity of rows ranges from 15 to 20, and the first solar cell edge, the second solar cell edge, the third solar cell edge, and the fourth solar cell edge at least include a portion intersecting with a direction of the rows of the front electrode pad array; and the plurality of back electrode pads are arranged in an array to form a back electrode pad array, where in the back electrode pad array, a quantity of columns ranges from 6 to 8, a quantity of rows ranges from 15 to 20, and the first solar cell edge, the second solar cell edge, the third solar cell edge, and the fourth solar cell edge at least include a portion intersecting with a direction of the rows of the back electrode pad array;

and/or the front electrode pad includes a first inner surface facing the first surface and a first outer surface facing away from the first surface, and an area of the first outer surface ranges from 0.01 mm$^2$ to 250000 mm$^2$; and the back electrode pad includes a second inner surface facing the second surface and a second outer surface facing away from the second surface, and an area of the second outer surface ranges from 0.01 mm$^2$ to 640000 mm$^2$.

BRIEF DESCRIPTION OF THE DRAWINGS

To describe the technical solutions in the embodiments of this application more clearly, the following briefly introduces the accompanying drawings required for describing the embodiments of this application. Apparently, the accompanying drawings in the following description show only some embodiments of this application, and a person of ordinary skill in the art may still derive other accompanying drawings from these accompanying drawings without creative efforts.

DESCRIPTION OF REFERENCE NUMERALS

Figure 1:
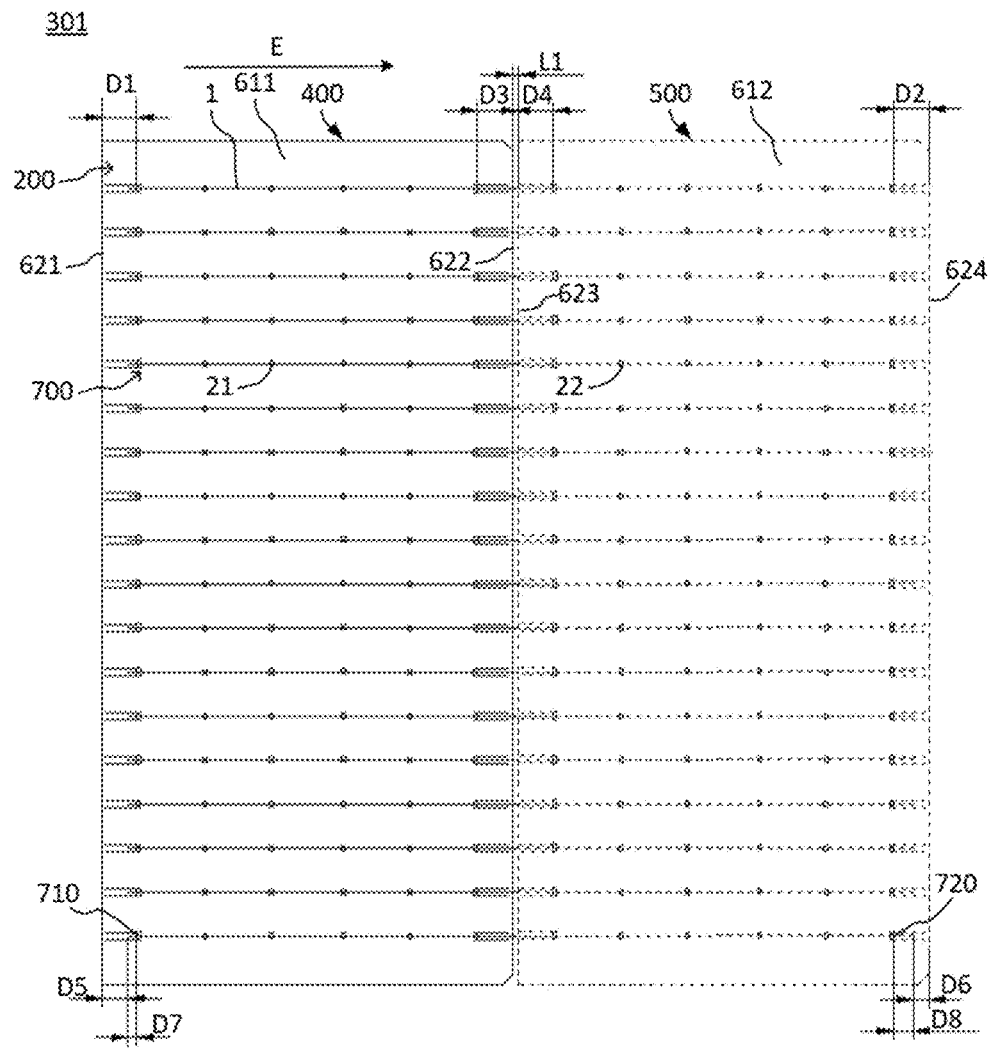
FIG. 1 is a schematic diagram of series connection of a series-connected unit according to an embodiment of this application.

300-Photovoltaic module, 301-Cell string, 310-Series-connected unit,
1-Conductive interconnection member, E-Extending direction of conductive interconnection member,
2-Solar cell, 400-First solar cell, 500-Second solar cell,
200-Solar cell body, 611-First surface, 612-Second surface, 621-First solar cell edge, 622-Second solar cell edge, 623-Third solar cell edge, 624-Fourth solar cell edge,
700-Electrode structure,
21-Front electrode pad, 710-Edge of front electrode pad, 771-First inner surface, 781-First outer surface,
22-Back electrode pad, 720-Edge of back electrode pad, 772-Second inner surface, 782-Second outer surface,
703-Front finger, 704-Back finger,
705-Front electrode pad array, 706-Back electrode pad array,
23-Edge without chamfered corner, 24-Chamfered edge, L1-First gap, L2-Second gap, and L3-Third gap.

DETAILED DESCRIPTION

The following clearly and completely describes the technical solutions in the embodiments of this application with reference to the accompanying drawings in the embodiments of this application. Apparently, the described embodiments are some of the embodiments of this application rather than all of the embodiments. All other embodiments obtained by a person of ordinary skill in the art based on the embodiments in this application without creative efforts shall fall within the protection scope of this application.

A main reason of high costs and poor performance in existing cell strings lies in that: in an extending direction of a conductive interconnection member, distances between edges 710 of two front electrode pads 21 respectively adjacent to two opposite solar cell edges in a solar cell 2 and solar cell edges respectively adjacent to the two front electrode pads 21 are the same, and distances between edges 720 of two back electrode pads 22 respectively adjacent to two opposite solar cell edges in the solar cell 2 and solar cell edges respectively adjacent to the two back electrode pads 22 are the same. As a result, a used conductive interconnection member has a long length and high costs, and the conductive interconnection member passes through a long distance, further leading to severe problems of twisting and warping of the conductive interconnection member, which brings a high risk of breaking and cracking.

Figure 2:
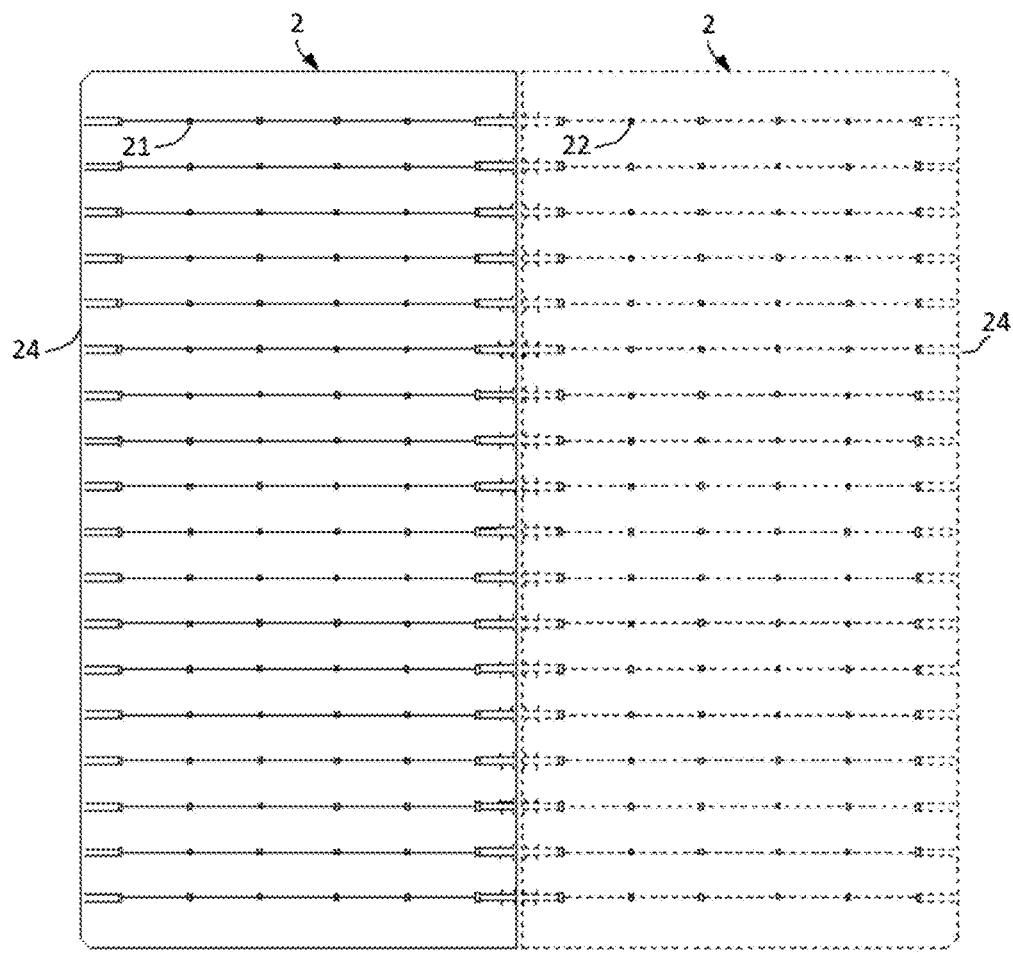
FIG. 2 is a schematic diagram of position arrangement of solar cells in a series-connected unit according to an embodiment of this application.
Figure 3:
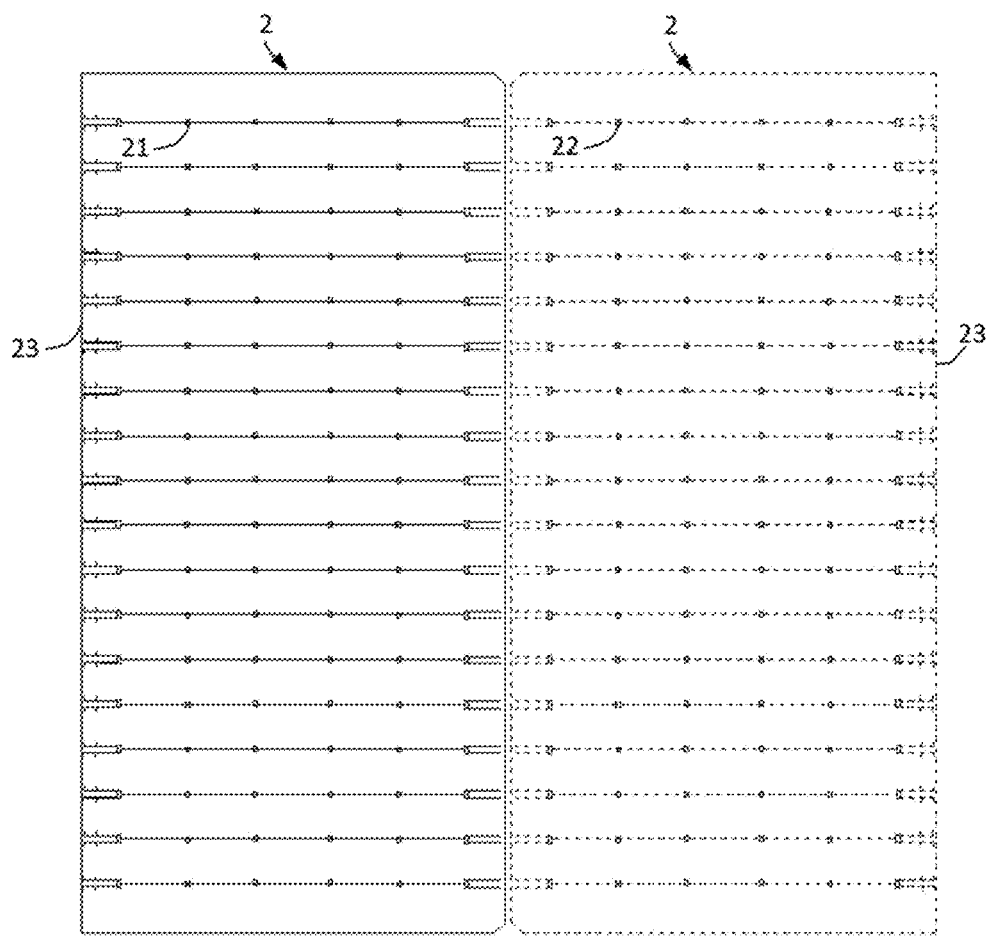
FIG. 3 is a schematic diagram of position arrangement of solar cells in another series-connected unit according to an embodiment of this application.

FIG. 1 is a schematic diagram of series connection of a series-connected unit 310 according to an embodiment of this application. FIG. 2 is a schematic diagram of position arrangement of solar cells 2 in a series-connected unit 310 according to an embodiment of this application. FIG. 3 is a schematic diagram of position arrangement of solar cells 2 in another series-connected unit 310 according to an embodiment of this application. FIG. 1 to FIG. 3 are not schematic diagrams of a surface of an actual cell string 301, and for ease of understanding of this application, two solar cells 2 are shown in FIG. 1 to FIG. 3, where a left part displays a first surface 611 of a first solar cell 400, and a right part displays a second surface 612 of a second solar cell 500. It should be noted that, all sizes in FIG. 1 are marked for illustration only and do not represent a relationship between relative sizes, and the relationship between relative sizes shall be subject to text description.

Figure 7:
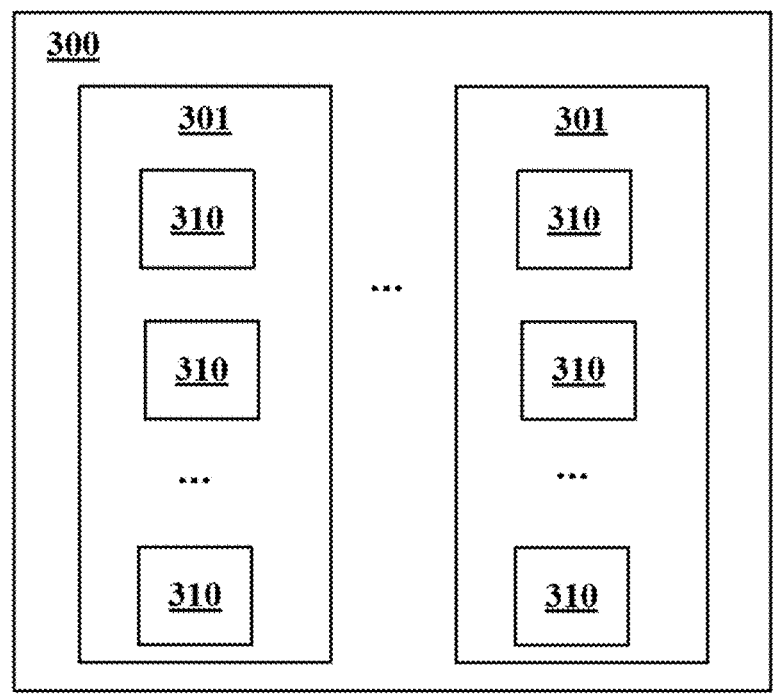
FIG. 7 is a schematic block diagram of a photovoltaic module according to an embodiment of this application.

FIG. 7 is a schematic block diagram of a photovoltaic module 300 according to an embodiment of this application. The photovoltaic module 300 includes one or more cell strings 301. The cell string 301 includes at least one series-connected unit 310. A quantity of cell strings 301 included in the photovoltaic module 300 is not specifically limited. A quantity of series-connected units 310 included in the cell string 301 is not specifically limited. In the cell string 301, adjacent series-connected units 310 are in electrical connection to each other, and the electrical connection herein may be series connection or parallel connection, which is not specifically limited.

Referring to FIG. 1, the series-connected unit 310 includes at least one conductive interconnection member 1, and a first solar cell 400 and a second solar cell 500 adjacent to each other in an extending direction E of the conductive interconnection member 1. The conductive interconnection member 1 herein may be a welding strip or the like, which is not specifically limited. The extending direction E of the conductive interconnection member 1 may be a direction of a length of the conductive interconnection member 1.

Referring to FIG. 1, the first solar cell 400 and the second solar cell 500 each include: a solar cell body 200 and an electrode structure 700. The electrode structure 700 is configured to lead out a current of the solar cell 2. The solar cell body 200 is a part other than the electrode structure 700 in the solar cell 2, and in a normal working process, the solar cell body 200 may generate and separate carriers, where the carriers herein are holes and electrons.

The solar cell body 200 includes two solar cell edges opposite to each other, and a first surface 611 and a second surface 612 opposite to each other. The first surface 611 is a side surface mainly absorbing illumination in a normal working process of the solar cell 2; and the second surface 612 is opposite to the first surface 611. The solar cell edge is an edge of the solar cell body 200, which may be an edge 23 without a chamfered corner such as a cutting edge formed through cutting, or may be a chamfered edge 24 with a chamfered corner, or the like.

The electrode structure 700 includes a plurality of front electrode pads 21 and a plurality of back electrode pads 22, the plurality of front electrode pads 21 are located on the first surface 611, and the plurality of back electrode pads 22 are located on the second surface 612. The front electrode pads 21 and the back electrode pads 22 are all configured to lead out a current of the solar cell body 200. In the electrode structure 700, a total quantity of the front electrode pads 21 is not specifically limited, and a total quantity of the back electrode pads 22 is also not specifically limited. In the electrode structure 700, whether the total quantity of the front electrode pads 21 and the total quantity of the back electrode pads 22 are the same is not specifically limited. For example, the total quantity of the front electrode pads 21 and the total quantity of the back electrode pads 22 may be the same, or the total quantity of the front electrode pads 21 and the total quantity of the back electrode pads 22 may be different. In addition, it should be noted that, the front electrode pad 21 may be an electrode corresponding to a positive grid line or may be an electrode corresponding to a negative grid line, and the back electrode pad 22 is the other.

Referring to FIG. 1, the conductive interconnection member 1 is electrically connected to the front electrode pads 21 of the first solar cell 400 and the back electrode pads 22 of the second solar cell 500, and in the extending direction E of the conductive interconnection member 1, a first solar cell edge 621 and a second solar cell edge 622 of the first solar cell 400 and a third solar cell edge 623 and a fourth solar cell edge 624 of the second solar cell 500 are arranged sequentially. In this specification, for ease of description, the solar cell 2 on the left side is referred to as the first solar cell 400, the solar cell 2 on the right side is referred to as the second solar cell 500, two solar cell edges of the first solar cell 400 are referred to as the first solar cell edge 621 and the second solar cell edge 622, and two solar cell edges of the second solar cell 500 are referred to as the third solar cell edge 623 and the fourth solar cell edge 624. In this way, in the extending direction E of the conductive interconnection member 1, the first solar cell edge 621 and the second solar cell edge 622 of the first solar cell 400 and the third solar cell edge 623 and the fourth solar cell edge 624 of the second solar cell 500 are arranged sequentially. It may be understood that, in an actual application, relative positions of the first solar cell 400 and the second solar cell 500 in the series-connected unit 310 can be exchanged.

Still referring to FIG. 1, in the extending direction E of the conductive interconnection member 1, a distance between the first solar cell edge 621 and the front electrode pad 21 adjacent to the first solar cell edge 621 is defined as D1, a distance between the second solar cell edge 622 and the front electrode pad 21 adjacent to the second solar cell edge 622 is defined as D3, a distance between the fourth solar cell edge 624 and the back electrode pad 22 adjacent to the fourth solar cell edge 624 is defined as D2, a distance between the third solar cell edge 623 and the back electrode pad 22 adjacent to the third solar cell edge 623 is defined as D4, and a sum of D1 and D2 is greater than a sum of D3 and D4.

"The front electrode pad 21 adjacent to the first solar cell edge 621" may also be described as a front electrode pad 21 farthest away from the second solar cell 500 in the first solar cell 400; "the front electrode pad 21 adjacent to the second solar cell edge 622" may also be described as a front electrode pad 21 closest to the second solar cell 500 in the first solar cell 400; "the back electrode pad 22 adjacent to the fourth solar cell edge 624" may also be described as a back electrode pad 22 farthest away from the first solar cell 400 in the second solar cell 500; and "the back electrode pad 22 adjacent to the third solar cell edge 623" may also be described as a back electrode pad 22 closest to the first solar cell 400 in the second solar cell 500.

D1, D2, D3, and D4 are all distances in the extending direction E of the conductive interconnection member 1. Generally, D1 may be a distance between the first solar cell edge 621 and an edge 710 of the front electrode pad 21 adjacent to the first solar cell edge 621; D3 may be a distance between the second solar cell edge 622 and an edge 710 of the front electrode pad 21 adjacent to the second solar cell edge 622; D2 may be a distance between the fourth solar cell edge 624 and an edge 720 of the back electrode pad 22 adjacent to the fourth solar cell edge 624; and D4 may be a distance between the third solar cell edge 623 and an edge 720 of the back electrode pad 22 adjacent to the third solar cell edge 623.

In the extending direction E of the conductive interconnection member 1, the front electrode pad 21 includes two edges 710, and using a solar cell edge to which the front electrode pad 21 is adjacent as a reference, one of the two edges is an edge close to the solar cell edge, and the other is an edge away from the solar cell edge; and similarly, in the extending direction E of the conductive interconnection member 1, the back electrode pad 22 includes two edges 720, and using a solar cell edge to which the back electrode pad 22 is adjacent as a reference, one of the two edges is an edge close to the solar cell edge, and the other is an edge away from the solar cell edge. In this specification, when an edge of an electrode is mentioned, the edge may be an edge of the electrode close to a solar cell edge, or may be an edge of the electrode away from the solar cell edge. However, for calculation of the distances D1, D2, D3, and D4, corresponding edges selected for the fourth distances should be consistent. Using FIG. 1 as an example, D1 may be a distance between the first solar cell edge 621 and an edge on a left side of the front electrode pad 21 adjacent to the first solar cell edge 621 (that is, an edge close to the first solar cell edge 621). In this case, D3 is a distance between the second solar cell edge 622 and an edge on a right side of the front electrode pad 21 adjacent to the second solar cell edge 622 (that is, an edge close to the second solar cell edge 622), D2 is a distance between the fourth solar cell edge 624 and an edge on a right side of the back electrode pad 22 adjacent to the fourth solar cell edge 624 (that is, an edge close to the fourth solar cell edge 624), and D4 is a distance between the third solar cell edge 623 and an edge on a left side of the back electrode pad 22 adjacent to the third solar cell edge 623 (that is, an edge close to the third solar cell edge 623). Alternatively, D1 may be a distance between the first solar cell edge 621 and an edge on a right side of the front electrode pad 21 adjacent to the first solar cell edge 621 (that is, an edge away from the first solar cell edge 621). In this case, D3 may be a distance between the second solar cell edge 622 and an edge on a left side of the front electrode pad 21 adjacent to the second solar cell edge 622 (that is, an edge away from the second solar cell edge 622), D2 is a distance between the fourth solar cell edge 624 and an edge on a left side of the back electrode pad 22 adjacent to the fourth solar cell edge 624 (that is, an edge away from the fourth solar cell edge 624), and D4 may be a distance between the third solar cell edge 623 and an edge on a right side of the back electrode pad 22 adjacent to the third solar cell edge 623 (that is, an edge away from the third solar cell edge 623).

In the embodiments of this application, in the series-connected unit 310, the conductive interconnection member 1 is electrically connected to the front electrode pads 21 of the first solar cell 400 and the back electrode pads 22 of the second solar cell 500. In this way, in the extending direction E of a conductive interconnection member 1 (using FIG. 1 as an example, a direction from left to right), the conductive interconnection member 1 mainly extends and covers the front electrode pad 21 adjacent to the first solar cell edge 621, the second solar cell edge 622, the third solar cell edge 623, and the back electrode pad 22 adjacent to the fourth solar cell edge 624. An edge 710 of the front electrode pad 21 adjacent to the first solar cell edge 621 is approximately a start bonding point of the conductive interconnection member 1, and an edge 720 of the back electrode pad 22 adjacent to the fourth solar cell edge 624 is approximately an end bonding point of the conductive interconnection member 1. It may be understood that, when the extending direction E of the conductive interconnection member 1 is reverse (for example, using FIG. 1 as an example, a direction from right to left), the start bonding point and the end bonding point are exchanged. In other words, in the extending direction E of the conductive interconnection member 1, the conductive interconnection member 1 mainly needs to cover a length obtained by subtracting the distance D1 between the first solar cell edge 621 and the front electrode pad 21 adjacent to the first solar cell edge 621 and the distance D2 between the fourth solar cell edge 624 and the back electrode pad 22 adjacent to the fourth solar cell edge 624 from a sum of a size of the first solar cell 400 and a size of the second solar cell 500. That is, the conductive interconnection member 1 needs to pass through the distance D3 between the second solar cell edge 622 and the front electrode pad 21 adjacent to the second solar cell edge 622 and the distance D4 between the third solar cell edge 623 and the back electrode pad 22 adjacent to the third solar cell edge 623; but does not need to pass through the distance D1 between the first solar cell edge 621 and the front electrode pad 21 adjacent to the first solar cell edge 621 and the distance D2 between the fourth solar cell edge 624 and the back electrode pad 22 adjacent to the fourth solar cell edge 624. In the embodiments of this application, the sum of D1 and D2 is greater than the sum of D3 and D4, so that the start bonding point and the end bonding point are recessed inward in the extending direction E of the conductive interconnection member 1. Specifically, in a case that the size of the solar cell 2 is fixed, a larger sum of D1 and D2 indicates a larger sum of inward recesses of the start bonding point and the end bonding point, and a longer distance that the conductive interconnection member 1 does not need to pass through, that is, a shorter length of the conductive interconnection member 1; and a larger sum of D3 and D4 indicates a longer distance that the conductive interconnection member 1 needs to pass through, that is, a longer length of the conductive interconnection member 1. In the embodiments of this application, the sum of D1 and D2 is greater than the sum of D3 and D4, that is, the start bonding point and the end bonding point of the conductive interconnection member 1 are recessed inward, so that the length of the conductive interconnection member 1 is reduced, and costs are reduced. In addition, the conductive interconnection member 1 passes through a short distance, so that a probability of twisting and warping of the conductive interconnection member 1 at the start bonding point and the end bonding point is further reduced, and a risk of breaking and cracking is reduced.

For example, in FIG. 1, the extending direction E of the conductive interconnection member 1 is approximately a direction from left to right; for the first solar cell 400, a distance between the first solar cell edge 621 and a leftmost front electrode pad 21 is defined as D1, and a distance between the second solar cell edge 622 and a rightmost front electrode pad 21 is defined as D3; for the second solar cell 500, a distance between the fourth solar cell edge 624 and a rightmost back electrode pad 22 is defined as D2, and a distance between the third solar cell edge 623 and a leftmost back electrode pad 22 is defined as D4; and a sum of D1 and D2 is greater than a sum of D3 and D4. An edge 710 of the leftmost front electrode pad 21 is approximately a start bonding point of the conductive interconnection member 1, and an edge 720 of the rightmost back electrode pad 22 is approximately an end bonding point of the conductive interconnection member 1. The sum of D1 and D2 is greater than the sum of D3 and D4, so that the start bonding point and the end bonding point of the conductive interconnection member 1 are recessed inward, the length of the conductive interconnection member 1 is further reduced, and costs are reduced. In addition, the conductive interconnection member 1 passes through a short distance, so that a probability of twisting and warping of the conductive interconnection member 1 at the start bonding point and the end bonding point is further reduced, and a risk of breaking and cracking is reduced.

The two solar cell edges arranged opposite to each other of the solar cell body 200 may include: an edge 23 without a chamfered corner and a chamfered edge 24 with a chamfered corner. In the series-connected unit 310, arrangement manners of the first solar cell 400 and the second solar cell 500 are flexible and diversified.

Optionally, the first solar cell edge 621 is the chamfered edge 24 with a chamfered corner, and the second solar cell edge 622 is the edge 23 without a chamfered corner; or the first solar cell edge 621 is the edge 23 without a chamfered corner, and the second solar cell edge 622 is the chamfered edge 24; and the third solar cell edge 623 is the chamfered edge 24, and the fourth solar cell edge 624 is the edge 23 without a chamfered corner; or the third solar cell edge 623 is the edge 23 without a chamfered corner, and the fourth solar cell edge 624 is the chamfered edge 24. Specifically, the first solar cell edge 621 is the chamfered edge 24, the second solar cell edge 622 is the edge 23 without a chamfered corner, the third solar cell edge 623 is the chamfered edge 24, and the fourth solar cell edge 624 is the edge 23 without a chamfered corner; or the first solar cell edge 621 is the chamfered edge 24, the second solar cell edge 622 is the edge 23 without a chamfered corner, the third solar cell edge 623 is the edge 23 without a chamfered corner, and the fourth solar cell edge 624 is the chamfered edge 24; or the first solar cell edge 621 is the edge 23 without a chamfered corner, the second solar cell edge 622 is the chamfered edge 24, the third solar cell edge 623 is the chamfered edge 24, and the fourth solar cell edge 624 is the edge 23 without a chamfered corner; or the first solar cell edge 621 is the edge 23 without a chamfered corner, the second solar cell edge 622 is the chamfered edge 24, the third solar cell edge 623 is the edge 23 without a chamfered corner, and the fourth solar cell edge 624 is the chamfered edge 24. Referring to FIG. 1, in the series-connected unit 310, the chamfered edge 24 of the first solar cell 400 is adjacent to the edge 23 without a chamfered corner of the second solar cell 500. Referring to FIG. 2, in the series-connected unit 310, the edge 23 without a chamfered corner of the first solar cell 400 is adjacent to the edge 23 without a chamfered corner of the second solar cell 500. Referring to FIG. 3, in the series-connected unit 310, the chamfered edge 24 of the first solar cell 400 is adjacent to the chamfered edge 24 of the second solar cell 500.

Optionally, a ratio of the sum of D1 and D2 to the sum of D3 and D4 is greater than 1 and less than 2.5. In this way, a ratio of the two sums is suitable, so that costs are reduced, twisting and warping of the conductive interconnection member 1 are reduced, and a good effect of reducing breaking and creaking is achieved. In addition, no adverse impact will be brought to performance such as contact resistance of a subsequently formed photovoltaic module 300, so that the subsequently formed photovoltaic module 300 can still keep excellent performance.

For example, the ratio of the sum of D1 and D2 to the sum of D3 and D4 may be 1.01, 1.1, 1.2, 1.3, 1.4, 1.5, 1.6, 1.7, 1.75, 1.8, 1.9, 2, 2.1, 2.2, 2.3, 2.4, or 2.499.

Optionally, the ratio of the sum of D1 and D2 to the sum of D3 and D4 is greater than 1.5 and less than 2. In this way, a ratio of the two sums is suitable, so that costs are reduced, twisting and warping of the conductive interconnection member 1 are reduced, and a good effect of reducing breaking and creaking is achieved. In addition, no adverse impact will be brought to performance such as contact resistance of a subsequently formed photovoltaic module 300, so that the subsequently formed photovoltaic module 300 can still keep excellent performance.

For example, the ratio of the sum of D1 and D2 to the sum of D3 and D4 may be 1.51, 1.6, 1.62, 1.66, 1.7, 1.74, 1.75, 1.8, 1.83, 1.85, 1.88, 1.9, 1.93, 1.97, or 1.999.

Optionally, referring to FIG. 1 to FIG. 3, in the extending direction E of the conductive interconnection member 1, a first gap L1 exists between the first solar cell 400 and the second solar cell 500. That is, the first gap L1 exists between the second solar cell edge 622 and the third solar cell edge 623. The sum of D1 and D2 is greater than a sum of D3, D4, and the first gap L1. In this way, the sizes are suitable, so that costs are reduced, twisting and warping of the conductive interconnection member 1 are reduced, and a good effect of reducing breaking and creaking is achieved. In addition, no adverse impact will be brought to performance such as contact resistance of a subsequently formed photovoltaic module 300, so that the subsequently formed photovoltaic module 300 can still keep excellent performance.

Optionally, referring to FIG. 1 to FIG. 3, in the extending direction E of the conductive interconnection member 1, a first gap L1 exists between the first solar cell 400 and the second solar cell 500, and the first gap L1 ranges from 0.5 mm to 5 mm. In this way, the first gap L1 has a suitable size, so that a merging risk is small. That is, a problem that the solar cell is prone to breaking due to large bending of a welding strip caused by small space can be avoided. In addition, space in the cell string 301 can be fully utilized.

For example, in the extending direction E of the conductive interconnection member 1, a first gap L1 exists between the first solar cell 400 and the second solar cell 500, and the first gap L1 may be 0.5 mm, 0.61 mm, 0.72 mm, 1 mm, 1.1 mm, 1.7 mm, 2 mm, 2.5 mm, 3 mm, 3.41 mm, 4 mm, 4.5 mm, or 5 mm.

Figure 6:
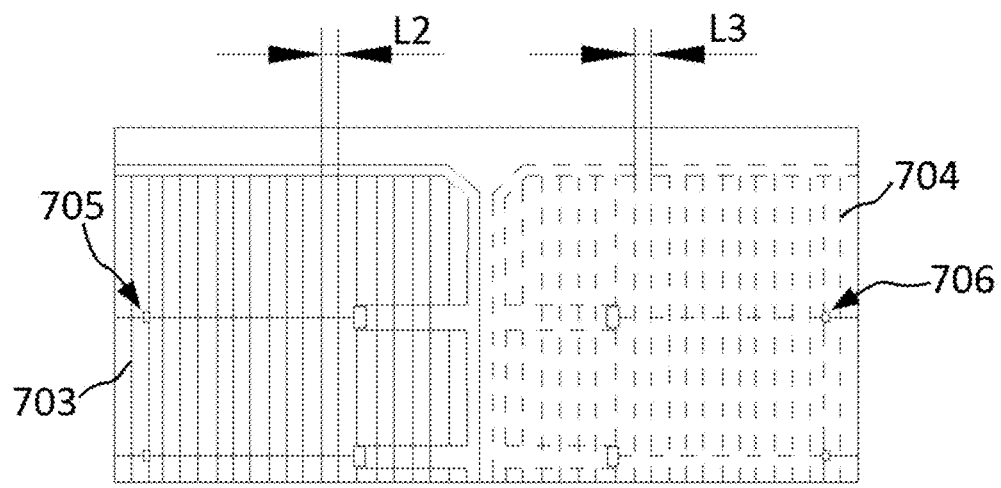
FIG. 6 is a partial schematic enlarged view of a series-connected unit.

Optionally, the electrode structure 700 may further include a plurality of front fingers 703 distributed in parallel. Referring to FIG. 6, FIG. 6 is a partial schematic enlarged view of FIG. 3 and shows several front fingers 703. The front finger 703 is configured to collect carriers in the solar cell body 200. The front finger 703 is located on the first surface 611 of the solar cell body 200 and is electrically connected to the front electrode pad 21.

As shown in FIG. 6, a second gap L2 exists between two adjacent front fingers 703. A direction in which the second gap L2 is located is perpendicular to an extending direction of the front finger 703.

Optionally, D1 is greater than 2 times the second gap L2 and less than 11 times the second gap L2. In this way, D1 is set to a suitable value, so that costs are reduced, and an effect of reducing breaking and creaking is apparent. In addition, no adverse impact will be brought to performance such as contact resistance of a subsequently formed photovoltaic module 300, so that the subsequently formed photovoltaic module 300 can still keep excellent performance.

For example, D1 may be 2.001 times the second gap, 2.008 times the second gap, 2.1 times the second gap, 2.73 times the second gap, 3 times the second gap, 3.71 times the second gap, 4 times the second gap, 4.5 times the second gap, 5 times the second gap, 5.17 times the second gap, 6 times the second gap, 6.5 times the second gap, 6.87 times the second gap, 7 times the second gap, 7.3 times the second gap, 8 times the second gap, 8.47 times the second gap, 9 times the second gap, 9.42 times the second gap, 10 times the second gap, 10.33 times the second gap, 10.5 times the second gap, or 10.99 times the second gap. In another example, D1 may be 9.098 mm.

Optionally, D3 is greater than 2 times the second gap L2 and less than 11 times the second gap L2. In this way, D3 is set to a suitable value, so that costs are reduced, and an effect of reducing breaking and creaking is apparent. In addition, no adverse impact will be brought to performance such as contact resistance of a subsequently formed photovoltaic module 300, so that the subsequently formed photovoltaic module 300 can still keep excellent performance.

For example, D3 may be 2.001 times the second gap, 2.007 times the second gap, 2.1 times the second gap, 2.73 times the second gap, 3 times the second gap, 3.71 times the second gap, 4 times the second gap, 4.5 times the second gap, 5 times the second gap, 5.17 times the second gap, 6 times the second gap, 6.5 times the second gap, 6.87 times the second gap, 7 times the second gap, 7.3 times the second gap, 8 times the second gap, 8.47 times the second gap, 9 times the second gap, 9.42 times the second gap, 10 times the second gap, 10.33 times the second gap, 10.5 times the second gap, or 10.99 times the second gap. In another example, D3 may be 5.496 mm.

Optionally, the electrode structure 700 may further include a plurality of back fingers 704 distributed in parallel. Referring to FIG. 6, FIG. 6 is a partial schematic enlarged view of FIG. 3 and shows several back fingers 704. The back finger 704 is configured to collect carriers in the solar cell body 200. The back finger 704 is located on the second surface 612 of the solar cell body 200 and is electrically connected to the back electrode pad 22.

As shown in FIG. 6, a third gap L3 exists between two adjacent back fingers 704. A direction in which the third gap L3 is located is perpendicular to an extending direction of the back finger 704.

Optionally, D2 is greater than 2 times the third gap L3 and less than 11 times the third gap L3. In this way, D2 is set to a suitable value, so that costs are reduced, and an effect of reducing breaking and creaking is apparent. In addition, no adverse impact will be brought to performance such as contact resistance of a subsequently formed photovoltaic module 300, so that the subsequently formed photovoltaic module 300 can still keep excellent performance.

For example, D2 may be 2.001 times the third gap, 2.008 times the third gap, 2.1 times the third gap, 2.46 times the third gap, 3 times the third gap, 3.71 times the third gap, 4 times the third gap, 4.5 times the third gap, 5 times the third gap, 5.33 times the third gap, 6 times the third gap, 6.5 times the third gap, 6.87 times the third gap, 7 times the third gap, 7.3 times the third gap, 8 times the third gap, 8.47 times the third gap, 9 times the third gap, 9.42 times the third gap, 10 times the third gap, 10.33 times the third gap, 10.5 times the third gap, or 10.99 times the third gap. In another example, D2 may be 9.6995 mm.

Optionally, D4 is greater than 2 times the third gap L3 and less than 11 times the third gap L3. In this way, D4 is set to a suitable value, so that costs are reduced, and an effect of reducing breaking and creaking is apparent. In addition, no adverse impact will be brought to performance such as contact resistance of a subsequently formed photovoltaic module 300, so that the subsequently formed photovoltaic module 300 can still keep excellent performance.

For example, D4 may be 2.001 times the third gap, 2.008 times the third gap, 2.1 times the third gap, 2.46 times the third gap, 3 times the third gap, 3.71 times the third gap, 4 times the third gap, 4.5 times the third gap, 5 times the third gap, 5.33 times the third gap, 6 times the third gap, 6.5 times the third gap, 6.87 times the third gap, 7 times the third gap, 7.3 times the third gap, 8 times the third gap, 8.5 times the third gap, 9 times the third gap, 9.42 times the third gap, 10 times the third gap, 10.33 times the third gap, 10.5 times the third gap, or 10.99 times the third gap. In another example, D4 may be 5.8395 mm.

In an example in which D1 is 9.098 mm, D3 is 5.496 mm, D2 is 9.6995 mm, and D4 is 5.8395 mm,
the sum of D1 and D2 is: D1+D2-9.098 mm+9.6995 mm=18.7975 mm;
the sum of D3 and D4 is: D3+D4-5.496 mm+5.8395 mm=11.3355 mm; and
the sum of D1 and D2 is greater than the sum of D3 and D4, and the ratio of the sum of D1 and D2 to the sum of D3 and D4 is: (D1+D2)/(D3+D4)=1.66.

Optionally, D1 ranges from 2 mm to 15 mm. In this way, D1 is set to a suitable value, so that costs are reduced, and an effect of reducing breaking and creaking is apparent. In addition, no adverse impact will be brought to performance such as contact resistance of a subsequently formed photovoltaic module 300, so that the subsequently formed photovoltaic module 300 can still keep excellent performance.

For example, D1 may be 2 mm, 2.1 mm, 2.7 mm, 3 mm, 3.41 mm, 4 mm, 4.62 mm, 5 mm, 5.5 mm, 5.72 mm, 6 mm, 6.4 mm, 7 mm, 7.28 mm, 8 mm, 8.5 mm, 8.6 mm, 9 mm, 9.7 mm, 10 mm, 10.2 mm, 10.5 mm, 11 mm, 11.3 mm, 12 mm, 12.7 mm, 13 mm, 13.5 mm, 14 mm, 14.2 mm, or 15 mm.

Optionally, D2 ranges from 2 mm to 15 mm. In this way, D2 is set to a suitable value, so that costs are reduced, and an effect of reducing breaking and creaking is apparent. In addition, no adverse impact will be brought to performance such as contact resistance of a subsequently formed photovoltaic module 300, so that the subsequently formed photovoltaic module 300 can still keep excellent performance.

For example, D2 may be 2 mm, 2.1 mm, 2.7 mm, 3 mm, 3.41 mm, 4 mm, 4.62 mm, 5 mm, 5.5 mm, 5.72 mm, 6 mm, 6.4 mm, 7 mm, 7.1 mm, 8 mm, 8.5 mm, 8.6 mm, 9 mm, 9.7 mm, 10 mm, 10.2 mm, 10.5 mm, 11 mm, 11.3 mm, 12 mm, 12.7 mm, 13 mm, 13.5 mm, 14 mm, 14.2 mm, or 15 mm.

Optionally, D3 ranges from 2 mm to 15 mm. In this way, D3 is set to a suitable value, so that costs are reduced, and an effect of reducing breaking and creaking is apparent. In addition, no adverse impact will be brought to performance such as contact resistance of a subsequently formed photovoltaic module 300, so that the subsequently formed photovoltaic module 300 can still keep excellent performance.

For example, D3 may be 2 mm, 2.1 mm, 2.7 mm, 3 mm, 3.41 mm, 4 mm, 4.5 mm, 5 mm, 5.5 mm, 5.72 mm, 6 mm, 6.4 mm, 7 mm, 7.1 mm, 8 mm, 8.5 mm, 8.6 mm, 9 mm, 9.7 mm, 10 mm, 10.2 mm, 10.5 mm, 11 mm, 11.3 mm, 12 mm, 12.7 mm, 13 mm, 13.5 mm, 14 mm, 14.2 mm, or 15 mm.

Optionally, D4 ranges from 2 mm to 15 mm. In this way, D4 is set to a suitable value, so that costs are reduced, and an effect of reducing breaking and creaking is apparent. In addition, no adverse impact will be brought to performance such as contact resistance of a subsequently formed photovoltaic module 300, so that the subsequently formed photovoltaic module 300 can still keep excellent performance.

For example, D4 may be 2 mm, 2.1 mm, 2.7 mm, 3 mm, 3.5 mm, 4 mm, 4.62 mm, 5 mm, 5.5 mm, 5.72 mm, 6 mm, 6.4 mm, 7 mm, 7.1 mm, 8 mm, 8.5 mm, 8.6 mm, 9 mm, 9.7 mm, 10 mm, 10.2 mm, 10.5 mm, 11 mm, 11.3 mm, 12 mm, 12.7 mm, 13 mm, 13.5 mm, 14 mm, 14.2 mm, or 15 mm.

Optionally, D1 is greater than D3. In a case that a size of the first surface 611 is determined, by limiting D1 to be greater than D3, larger space can be freed up for D1, so that the conductive interconnection member 1 passes through a shorter distance, that is, the length of the conductive interconnection member 1 is shorter, thereby further reducing a probability of twisting and warping of the conductive interconnection member 1, and further reducing a risk of breaking and cracking.

Optionally, D1 is greater than D3, and a difference between D1 and D3 ranges from 1 mm to 10 mm. In this way, the difference is set to a suitable value, so that for batteries of a plurality of types, batteries of a plurality of sizes, and different first gaps L1, costs can all be reduced, and a risk of breaking and cracking can be reduced. In addition, no adverse impact will be brought to performance of the solar cell and performance such as contact resistance of a subsequently formed photovoltaic module 300, so that the solar cell and the subsequently formed photovoltaic module 300 can still keep excellent performance.

For example, D1 is greater than D3, and the difference between D1 and D3 may be 1 mm, 1.1 mm, 1.7 mm, 2 mm, 2.5 mm, 3 mm, 3.5 mm, 4 mm, 4.5 mm, 5 mm, 5.5 mm, 5.72 mm, 6 mm, 6.4 mm, 7 mm, 7.28 mm, 8 mm, 8.6 mm, 9 mm, 9.7 mm, or 10 mm. In another example, in an example in which D1 is 9.098 mm and D3 is 5.496 mm, the difference between D1 and D3 is 3.602 mm.

Optionally, the electrode structure 700 further includes: a plurality of front fingers 703 distributed in parallel. The front fingers 703 are located on the first surface 611 of the solar cell body 200 and are electrically connected to the front electrode pads 21, and a second gap L2 exists between two adjacent front fingers 703, where the difference between D1 and D3 is greater than 1 times the second gap L2 and less than 6 times the second gap L2. For the front finger 703 and the second gap L2, reference may be made to the related description above. In this way, the difference is set to a suitable value, so that for batteries of a plurality of types, batteries of a plurality of sizes, and different first gaps L1, costs can all be reduced, and a risk of breaking and cracking can be reduced. In addition, no adverse impact will be brought to performance such as contact resistance of a subsequently formed photovoltaic module 300, so that the subsequently formed photovoltaic module 300 can still keep excellent performance.

For example, D1 is greater than D3, and the difference between D1 and D3 may be 1.001 times the second gap, 1.1 times the second gap, 1.37 times the second gap, 1.79 times the second gap, 2 times the second gap, 2.5 times the second gap, 2.71 times the second gap, 3 times the second gap, 3.27 times the second gap, 3.8 times the second gap, 4 times the second gap, 4.33 times the second gap, 4.5 times the second gap, 5 times the second gap, 5.17 times the second gap, 5.83 times the second gap, or 5.99 times the second gap.

Optionally, D2 is greater than D4. In a case that a size of the second surface 612 is determined, by limiting D2 to be greater than D4, larger space can be freed up for D2, so that the conductive interconnection member 1 passes through a shorter distance, that is, the length of the conductive interconnection member 1 is shorter, thereby further reducing a probability of twisting and warping of the conductive interconnection member 1, and further reducing a risk of breaking and cracking.

Optionally, D2 is greater than D4, and a difference between D2 and D4 ranges from 0.5 mm to 10 mm. In this way, the difference is set to a suitable value, so that for batteries of a plurality of types, batteries of a plurality of sizes, and different first gaps L1, costs can all be reduced, and a risk of breaking and cracking can be reduced. In addition, no adverse impact will be brought to performance of the solar cell and performance such as contact resistance of a subsequently formed photovoltaic module 300, so that the solar cell and the subsequently formed photovoltaic module 300 can still keep excellent performance.

For example, D2 is greater than D4, and the difference between D2 and D4 may be 0.5 mm, 0.62 mm, 1 mm, 1.1 mm, 1.7 mm, 2 mm, 2.5 mm, 3 mm, 3.5 mm, 4 mm, 4.5 mm, 5 mm, 5.5 mm, 5.72 mm, 6 mm, 6.4 mm, 7 mm, 7.28 mm, 8 mm, 8.6 mm, 9 mm, 9.7 mm, or 10 mm. In another example, in an example in which D2 is 9.6995 mm and D4 is 5.8395 mm, the difference between D2 and D4 is 3.86 mm.

Optionally, the electrode structure 700 further includes: a plurality of back fingers 704 distributed in parallel. The back fingers 704 are located on the second surface 612 of the solar cell body 200 and are electrically connected to the back electrode pads 22, and a third gap L3 exists between two adjacent back fingers 704, where the difference between D2 and D4 is greater than 1 times the third gap L3 and less than 6 times the third gap L3. For the back finger 704 and the third gap L3, reference may be made to the related description above. In this way, the difference is set to a suitable value, so that for batteries of a plurality of types, batteries of a plurality of sizes, and different first gaps L1, costs can all be reduced, and a risk of breaking and cracking can be reduced. In addition, no adverse impact will be brought to performance such as contact resistance of a subsequently formed photovoltaic module 300, so that the subsequently formed photovoltaic module 300 can still keep excellent performance.

For example, D2 is greater than D4, and the difference between D2 and D4 may be 1.001 times the third gap, 1.1 times the third gap, 1.37 times the third gap, 1.79 times the third gap, 2 times the third gap, 2.5 times the third gap, 2.71 times the third gap, 3 times the third gap, 3.27 times the third gap, 3.8 times the third gap, 4 times the third gap, 4.33 times the third gap, 4.5 times the third gap, 5 times the third gap, 5.17 times the third gap, 5.83 times the third gap, or 5.99 times the third gap.

Optionally, referring to FIG. 1, in the extending direction E of the conductive interconnection member 1: a distance between the start bonding point of the conductive interconnection member 1 and the first solar cell edge 621 is defined as D5, a distance between the end bonding point of the conductive interconnection member 1 and the fourth solar cell edge 624 is defined as D6, and D5 is not equal to D6. An arrangement manner of the conductive interconnection member 1 is flexible and diversified.

Optionally, D5 is greater than D6. That is, the conductive interconnection member 1 is more recessed inward at the first solar cell edge 621. In this way, the length of the conductive interconnection member 1 is reduced, so that costs are reduced, and a risk of breaking and cracking is reduced. In addition, the first solar cell edge 621 is an edge on a front surface of the first solar cell 400, so that light blocking on the front surface of the conductive interconnection member 1 is also reduced.

Optionally, the electrode structure 700 further includes: a plurality of front fingers 703 distributed in parallel. The front fingers 703 are located on the first surface 611 of the solar cell body 200 and are electrically connected to the front electrode pads 21, and a second gap L2 exists between two adjacent front fingers 703, where D5 is greater than 1 times the second gap L2 and less than 11 times the second gap L2. For the front finger 703 and the second gap L2, reference may be made to the related description above. In this way, D5 is set to a suitable value, and good balance is achieved among several aspects of reducing the costs, reducing the risk of breaking and cracking, and reducing the light blocking on the front surface of the conductive interconnection member 1 by reducing the length of the conductive interconnection member 1.

For example, D5 may be 1.001 times the second gap, 2 times the second gap, 2.008 times the second gap, 2.1 times the second gap, 2.46 times the second gap, 3 times the second gap, 3.71 times the second gap, 4 times the second gap, 4.5 times the second gap, 5 times the second gap, 5.33 times the second gap, 6 times the second gap, 6.5 times the second gap, 6.87 times the second gap, 7 times the second gap, 7.3 times the second gap, 8 times the second gap, 8.5 times the second gap, 9 times the second gap, 9.42 times the second gap, 10 times the second gap, 10.33 times the second gap, 10.5 times the second gap, or 10.99 times the second gap.

Optionally, the electrode structure 700 further includes: a plurality of back fingers 704 distributed in parallel. The back fingers 704 are located on the second surface 612 of the solar cell body 200 and are electrically connected to the back electrode pads 22, and a third gap L3 exists between two adjacent back fingers 704, where D6 is greater than 1 times the third gap L3 and less than 11 times the third gap L3. For the back finger 704 and the third gap L3, reference may be made to the related description above. In this way, D6 is set to a suitable value, and good balance is achieved among several aspects of reducing the costs, reducing the risk of breaking and cracking, and reducing the light blocking on the front surface of the conductive interconnection member 1 by reducing the length of the conductive interconnection member 1.

For example, D6 may be 1.001 times the third gap, 2 times the third gap, 2.008 times the third gap, 2.1 times the third gap, 2.46 times the third gap, 3 times the third gap, 3.71 times the third gap, 4 times the third gap, 4.5 times the third gap, 5 times the third gap, 5.33 times the third gap, 6 times the third gap, 6.5 times the third gap, 6.87 times the third gap, 7 times the third gap, 7.3 times the third gap, 8 times the third gap, 8.5 times the third gap, 9 times the third gap, 9.42 times the third gap, 10 times the third gap, 10.33 times the third gap, 10.5 times the third gap, or 10.99 times the third gap.

Optionally, D5 ranges from 0.5 mm to 15 mm. In this way, D5 is set to a suitable value, and good balance is achieved among several aspects of reducing the costs, reducing the risk of breaking and cracking, and reducing the light blocking on the front surface of the conductive interconnection member 1 by reducing the length of the conductive interconnection member 1.

For example, D5 may be 0.5 mm, 0.52 mm, 0.82 mm, 0.99 mm, 1 mm, 1.21 mm, 1.5 mm, 2 mm, 2.1 mm, 2.5 mm, 3 mm, 3.5 mm, 4 mm, 4.5 mm, 5 mm, 5.5 mm, 5.72 mm, 6 mm, 6.4 mm, 7 mm, 7.28 mm, 7.75 mm, 8 mm, 8.6 mm, 9 mm, 9.7 mm, 10 mm, 10.5 mm, 11 mm, 11.5 mm, 12 mm, 12.5 mm, 13 mm, 13.5 mm, 14 mm, 14.5 mm, or 15 mm.

Optionally, D6 ranges from 0.5 mm to 15 mm. In this way, D6 is set to a suitable value, and good balance is achieved among several aspects of reducing the costs, reducing the risk of breaking and cracking, and reducing the light blocking on the front surface of the conductive interconnection member 1 by reducing the length of the conductive interconnection member 1.

For example, D6 may be 0.5 mm, 0.51 mm, 0.82 mm, 0.99 mm, 1 mm, 1.22 mm, 1.5 mm, 2 mm, 2.1 mm, 2.5 mm, 3 mm, 3.5 mm, 4 mm, 4.5 mm, 5 mm, 5.5 mm, 5.72 mm, 6 mm, 6.4 mm, 7 mm, 7.28 mm, 7.75 mm, 8 mm, 8.6 mm, 9 mm, 9.7 mm, 10 mm, 10.5 mm, 11 mm, 11.5 mm, 12 mm, 12.5 mm, 13 mm, 13.5 mm, 14 mm, 14.5 mm, or 15 mm.

Optionally, referring to FIG. 1, in the extending direction E of the conductive interconnection member 1: a distance between the start bonding point of the conductive interconnection member 1 and the front electrode pad 21 adjacent to the first solar cell edge 621 is defined as D7, a distance between the end bonding point of the conductive interconnection member 1 and the back electrode pad 22 adjacent to the fourth solar cell edge 624 is defined as D8, and D7 is not equal to D8. D7 is not equal to D8, so that arrangement manners of the solar cell 2 and the conductive interconnection member 1 are flexible and diversified.

Similar to D1, D2, D3, and D4, D7 and D8 are distances in the extending direction E of the conductive interconnection member 1. Generally, D7 may be a distance between the start bonding point of the conductive interconnection member 1 and the edge 710 of the front electrode pad 21 adjacent to the first solar cell edge 621, and D8 may be a distance between the end bonding point of the conductive interconnection member 1 and the edge 720 of the back electrode pad 22 adjacent to the fourth solar cell edge 624. Similarly, the edge may be an edge of the electrode adjacent to a solar cell edge, or may be an edge of the electrode away from the solar cell edge. However, for calculation of the distances D7 and D8, corresponding edges selected for the two distances should be consistent. Using FIG. 1 as an example, D7 may be a distance between the start bonding point of the conductive interconnection member 1 and an edge on a left side of the front electrode pad 21 adjacent to the first solar cell edge 621 (that is, an edge close to the first solar cell edge 621). In this case, D8 is a distance between the end bonding point of the conductive interconnection member 1 and an edge on a right side of the back electrode pad 22 adjacent to the fourth solar cell edge 624 (that is, an edge close to the fourth solar cell edge 624). Alternatively, D7 may be a distance between the start bonding point of the conductive interconnection member 1 and an edge on a right side of the front electrode pad 21 adjacent to the first solar cell edge 621 (that is, an edge away from the first solar cell edge 621). In this case, D8 is a distance between the end bonding point of the conductive interconnection member 1 and an edge on a left side of the back electrode pad 22 adjacent to the fourth solar cell edge 624 (that is, an edge away from the fourth solar cell edge 624).

It should be noted that, a case that D7 is greater than 0 is for ensuring reliable electrical connection between the conductive interconnection member 1 and the front electrode pad 21 adjacent to the first solar cell edge 621; and a case that D8 is greater than 0 is for ensuring reliable electrical connection between the conductive interconnection member 1 and the back electrode pad 22 adjacent to the fourth solar cell edge 624.

Optionally, D7 is less than D8. In this way, the length of the conductive interconnection member 1 is reduced, so that costs are reduced, and a risk of breaking and cracking is reduced. In addition, light blocking on the front surface of the conductive interconnection member 1 is also reduced.

Optionally, the electrode structure 700 further includes: a plurality of front fingers 703 distributed in parallel. The front fingers 703 are located on the first surface 611 of the solar cell body 200 and are electrically connected to the front electrode pads 21, and a second gap L2 exists between two adjacent front fingers 703, where D7 is greater than 1 times the second gap L2 and less than 5 times the second gap L2. For the front finger 703 and the second gap L2, reference may be made to the related description above correspondingly. In this way, D7 is set to a suitable value, so that electrical connection between the conductive interconnection member 1 and the front electrode pad 21 adjacent to the first solar cell edge 621 is reliable, an effect of reducing light blocking on the front surface of the conductive interconnection member 1 is also good, and a waste of the conductive interconnection member 1 is basically not caused. Optionally, D7 and D8 herein can also meet a relationship that D7 is less than D8.

For example, D7 may be 1.001 times the second gap, 2 times the second gap, 2.008 times the second gap, 2.1 times the second gap, 2.46 times the second gap, 3 times the second gap, 3.71 times the second gap, 4 times the second gap, 4.5 times the second gap, or 4.99 times the second gap.

Optionally, the electrode structure 700 further includes: a plurality of back fingers 704 distributed in parallel. The back fingers 704 are located on the second surface 612 of the solar cell body 200 and are electrically connected to the back electrode pads 22, and a third gap L3 exists between two adjacent back fingers 704, where D8 is greater than 1 times the third gap L3 and less than 5 times the third gap L3. For the back finger 704 and the third gap L3, reference may be made to the related description above correspondingly. In this way, D8 is set to a suitable value, so that electrical connection between the conductive interconnection member 1 and the back electrode pad 22 adjacent to the fourth solar cell edge 624 is reliable, an effect of reducing light blocking of the conductive interconnection member 1 is also good, and a waste of the conductive interconnection member 1 is basically not caused. Optionally, D7 and D8 herein can also meet a relationship that D7 is less than D8.

For example, D8 may be 1.001 times the third gap, 2 times the third gap, 2.008 times the third gap, 2.1 times the third gap, 2.46 times the third gap, 3 times the third gap, 3.71 times the third gap, 4 times the third gap, 4.5 times the third gap, or 4.99 times the third gap.

Optionally, D7 ranges from 0 mm to 15 mm. In this way, D7 is set to a suitable value, so that electrical connection between the conductive interconnection member 1 and the front electrode pad 21 adjacent to the first solar cell edge 621 is reliable, an effect of reducing light blocking on the front surface of the conductive interconnection member 1 is also good, and a waste of the conductive interconnection member 1 is basically not caused. Optionally, D7 and D8 herein can also meet a relationship that D7 is less than D8.

For example, D7 may be 0, 0.1 mm, 0.25 mm, 0.5 mm, 0.51 mm, 0.82 mm, 0.99 mm, 1 mm, 1.22 mm, 1.5 mm, 2 mm, 2.1 mm, 2.5 mm, 3 mm, 3.5 mm, 4 mm, 4.5 mm, 5 mm, 5.5 mm, 5.72 mm, 6 mm, 6.4 mm, 7 mm, 7.28 mm, 7.75 mm, 8 mm, 8.6 mm, 9 mm, 9.7 mm, 10 mm, 10.5 mm, 11 mm, 11.5 mm, 12 mm, 12.5 mm, 13 mm, 13.5 mm, 14 mm, 14.5 mm, or 15 mm.

Optionally, D8 ranges from 0 mm to 15 mm. In this way, D8 is set to a suitable value, so that electrical connection between the conductive interconnection member 1 and the back electrode pad 22 adjacent to the fourth solar cell edge 624 is reliable, an effect of reducing light blocking of the conductive interconnection member 1 is also good, and a waste of the conductive interconnection member 1 is basically not caused. Optionally, D7 and D8 herein can also meet a relationship that D7 is less than D8.

For example, D8 may be 0, 0.1 mm, 0.25 mm, 0.5 mm, 0.51 mm, 0.82 mm, 0.9 mm, 1 mm, 1.22 mm, 1.5 mm, 2 mm, 2.1 mm, 2.5 mm, 3 mm, 3.5 mm, 4 mm, 4.5 mm, 5 mm, 5.5 mm, 5.72 mm, 6 mm, 6.4 mm, 7 mm, 7.28 mm, 7.75 mm, 8 mm, 8.6 mm, 9 mm, 9.7 mm, 10 mm, 10.5 mm, 11 mm, 11.5 mm, 12 mm, 12.5 mm, 13 mm, 13.5 mm, 14 mm, 14.5 mm, or 15 mm.

Optionally, referring to FIG. 1 to FIG. 3, in the extending direction E of the conductive interconnection member 1, a first gap L1 exists between the first solar cell 400 and the second solar cell 500, where the sum of D3 and D4 is greater than 1.5 times the first gap L1 and less than 20 times the first gap L1. In this way, the sum of D3 and D4 is a suitable value, so that generation of a black border between adjacent solar cells 2 in the cell string 301, thereby effectively resolving a problem that the cell string is blackened.

For example, the sum of D3 and D4 may be 1.501 times the first gap, 2 times the first gap, 2.008 times the first gap, 2.1 times the first gap, 2.46 times the first gap, 3 times the first gap, 3.71 times the first gap, 4 times the first gap, 4.5 times the first gap, 5 times the first gap, 5.33 times the first gap, 6 times the first gap, 6.5 times the first gap, 6.87 times the first gap, 7 times the first gap, 7.3 times the first gap, 8 times the first gap, 8.5 times the first gap, 9 times the first gap, 9.42 times the first gap, 10 times the first gap, 10.33 times the first gap, 10.5 times the first gap, 10.75 times the first gap, 10.99 times the first gap, 11 times the first gap, 12.5 times the first gap, 13 times the first gap, 14.5 times the first gap, 15 times the first gap, 16.5 times the first gap, 17.5 times the first gap, 18.9 times the first gap, or 19.99 times the first gap.

Optionally, referring to FIG. 1 to FIG. 3, a length of the solar cell body 200 is greater than or equal to a width of the solar cell body 200. A difference between the length and the width of the solar cell body 200 is not specifically limited herein. The extending direction E of the conductive interconnection member 1 may intersect with a direction of the length of the solar cell body 200. Optionally, the solar cell edge at least includes a portion intersecting with a direction of the width of the solar cell body 200. That is, the first solar cell edge 621, the second solar cell edge 622, the third solar cell edge 623, and the fourth solar cell edge 624 at least include a portion intersecting with the direction of the width of the solar cell body 200, namely, D1, D2, D3, and D4 all are substantially in the extending direction E of the conductive interconnection member 1, thereby achieving effects of reducing costs and reducing breaking and cracking of the conductive interconnection member 1.

It should be noted that, when it is mentioned that two objects intersect with each other in this specification, an angle between the two objects is not specifically limited. For example, the two objects may be perpendicular to each other.

Optionally, referring to FIG. 1 to FIG. 3, the plurality of front electrode pads 21 are arranged in an array to form a front electrode pad array 705, where in the front electrode pad array 705, a quantity of columns ranges from 6 to 8, a quantity of rows ranges from 15 to 20, and the first solar cell edge 621, the second solar cell edge 622, the third solar cell edge 623, and the fourth solar cell edge 624 at least include a portion intersecting with a direction of the rows of the front electrode pad array 705. In this way, in the solar cell 2, an arrangement manner of the front electrode pads 21 is proper, which is beneficial to conduction of currents, and a subsequently formed photovoltaic module 300 has good performance.

Optionally, referring to FIG. 1 to FIG. 3, the plurality of back electrode pads 22 are arranged in an array to form a back electrode pad array 706, where in the back electrode pad array 706, a quantity of columns ranges from 6 to 8, a quantity of rows ranges from 15 to 20, and the first solar cell edge 621, the second solar cell edge 622, the third solar cell edge 623, and the fourth solar cell edge 624 at least include a portion intersecting with a direction of the rows of the back electrode pad array 706. In this way, in the solar cell 2, an arrangement manner of the back electrode pads 22 is proper, which is beneficial to conduction of currents, and a subsequently formed photovoltaic module 300 has good performance.

Figure 4:
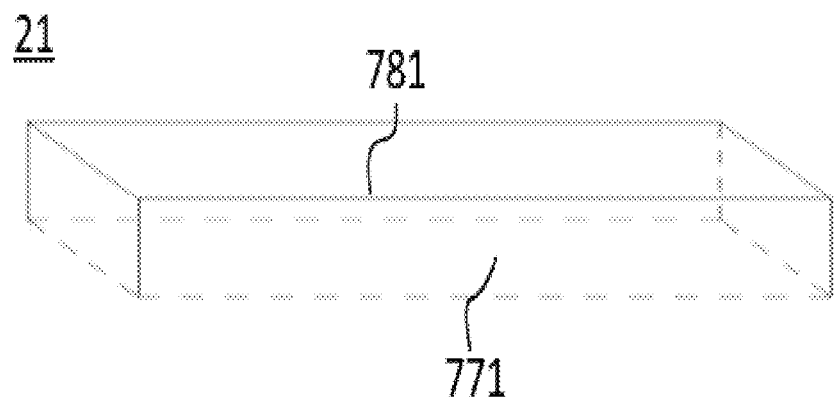
FIG. 4 is a schematic diagram of a front electrode pad according to an embodiment of this application.
Figure 5:
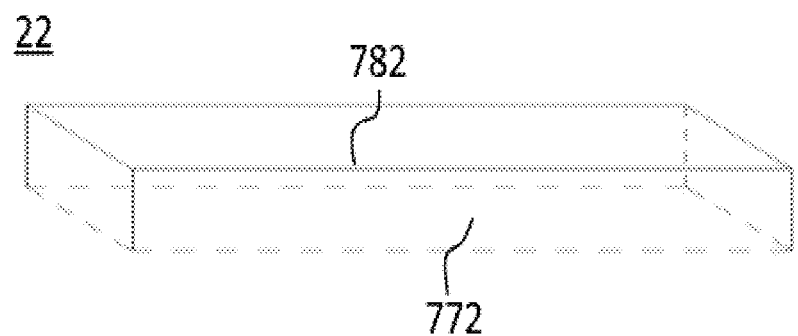
FIG. 5 is a schematic diagram of a back electrode pad according to an embodiment of this application.

Optionally, referring to FIG. 4, the front electrode pad 21 includes a first inner surface 771 facing the first surface 611 and a first outer surface 781 facing away from the first surface 611, and an area of the first outer surface 781 ranges from 0.01 mm$^2$ to 250000 mm$^2$; and referring to FIG. 5, the back electrode pad 22 includes a second inner surface 772 facing the second surface 612 and a second outer surface 782 facing away from the second surface 612, and an area of the second outer surface 782 ranges from 0.01 mm$^2$ to 640000 mm$^2$. In this way, the front electrode pads 21 and the back electrode pads 22 have suitable sizes, which are beneficial to conduction of currents.

It should be noted that, a shape of the first outer surface 781 of the front electrode pad 21 is not specifically limited. For example, the first outer surface 781 may be in a shape of a rectangle, a rectangle with a rounded corner or a chamfered corner, a circle, or the like. It should be noted that, a shape of the second outer surface 782 of the back electrode pad 22 is not specifically limited. For example, the second outer surface 782 may be in a shape of a rectangle, a rectangle with a rounded corner or a chamfered corner, a circle, or the like. In the rectangle mentioned in this specification, a length is equal to a width, or a length is greater than a width, which is not specifically limited.

For example, the front electrode pad 21 includes a first outer surface 781 facing away from the first surface 611, and an area of the first outer surface 781 may be 0.01 mm$^2$, 0.05 mm$^2$, 0.3 mm$^2$, 0.89 mm$^2$, 1 mm$^2$, 15 mm$^2$, 23 mm$^2$, 100 mm$^2$, 500 mm$^2$, 1000 mm$^2$, 8500 mm$^2$, 10000 mm$^2$, 35000 mm$^2$, 80000 mm$^2$, 100000 mm$^2$, 100800 mm$^2$, 125000 mm$^2$, 172000 mm$^2$, 200000 mm$^2$, or 250000 mm$^2$.

For example, the back electrode pad 22 includes a second outer surface 782 facing away from the second surface 612, and an area of the second outer surface 782 may be 0.01 mm$^2$, 0.05 mm$^2$, 0.3 mm$^2$, 0.89 mm$^2$, 1 mm$^2$, 15 mm$^2$, 23 mm$^2$, 100 mm$^2$, 500 mm$^2$, 1000 mm$^2$, 8500 mm$^2$, 10000 mm$^2$, 35000 mm$^2$, 80000 mm$^2$, 100000 mm$^2$, 100800 mm$^2$, 172000 mm$^2$, 200000 mm$^2$, 250000 mm$^2$, 300500 mm$^2$, 320000 mm$^2$, 423200 mm$^2$, 574000 mm$^2$, or 640000 mm$^2$.

Based on the above, in this application, the start bonding point and the end bonding point of the conductive interconnection member 1 are both recessed inward, so that the length of the conductive interconnection member 1 is greatly reduced. Therefore, the length of the conductive interconnection member 1 is greatly reduced, costs are reduced, and a risk of breaking and cracking is greatly reduced. More specifically, for a solar cell body 200 whose thickness ranges from 50 micrometers to 150 micrometers, through improvements of this application, in a case that the conductive interconnection member 1 is a welding strip, a welding tension is greater than or equal to 1.2 N (newton), and welding requirements are still met, where a welding yield rate is greater than or equal to 95%, a valid welding area is greater than or equal to 90%, and welding positions are on the first surface 611 and the second surface 612. The welding positions are distributed in a staggered manner in a thickness direction of the solar cell body 200, so that heating during welding is more uniform, and fault welding and mechanical stress concentration are avoided. Therefore, an overall welding yield rate is improved by 8% to 15%, a processing loss is reduced by 15% or more, a product yield rate is improved by 5% or more, and costs are reduced by 5% or more.

It should be noted that, for ease of description, the foregoing method embodiments are represented as a series of action combinations, but a person skilled in the art should know that the embodiments of this application are not limited to the described order of the actions because some steps may be performed in another order or performed simultaneously according to the embodiments of this application. In addition, a person skilled in the art should also know that the embodiments described in this specification are all preferred embodiments, and the actions involved are not necessarily required by the embodiments of this application.

It should be noted that, the terms "include", "comprise", or any other variants thereof in this specification are intended to cover non-exclusive inclusion, so that a process, a method, an object, or a device that includes a series of elements not only includes such elements, but also includes other elements not explicitly listed, or may further include inherent elements of the process, the method, the object, or the device. Without more limitations, an element defined by the statement "including a . . . " does not exclude existence of other same elements in the process, the method, the object, or the device that includes the element.

According to the description of the foregoing implementations, a person skilled in the art may clearly understand that the method according to the foregoing embodiments may be implemented by means of software and a necessary general hardware platform, and certainly, may alternatively be implemented by hardware, but in many cases, the former manner is a better implementation. Based on such an understanding, the technical solutions of this application essentially, or the part contributing to the related art may be implemented in a form of a software product. The computer software product is stored in a storage medium (such as a read-only memory (ROM)/random access memory (RAM), a magnetic disk, or an optical disc) and includes a plurality of instructions for instructing a terminal (which may be a mobile phone, a computer, a server, an air conditioner, a network device, or the like) to perform the methods described in the embodiments of this application.

The embodiments of this application are described above with reference to the accompanying drawings. However, this application is not limited to the foregoing specific implementations, and the foregoing specific implementations are merely illustrative but not limitative. Under the teaching of this application, a person of ordinary skill in the art may further make many forms without departing from the spirit of this application and the protection scope of the claims, and these forms all fall within the protection scope of this application.

What is claimed is:

1. A photovoltaic module comprising:
a conductive interconnection member, a first solar cell, and a second solar cell adjacent to the first solar cell along an extending direction of the conductive interconnection member, wherein the first solar cell and the second solar cell each comprise:
   a solar cell body having two solar cell edges opposite to one another, and a first surface and a second surface opposite to one another; and
   an electrode structure, comprising:
      a plurality of front electrode pads on the first surface of the solar cell body; and
      a plurality of back electrode pads on the second surface of the solar cell body; and
wherein the conductive interconnection member is electrically connected to one or more front electrode pads of the first solar cell and one or more back electrode pads of the second solar cell, and a quantity of the one or more front electrode pads is equal to a quantity of the one or more back electrode pads; and
wherein, in the extending direction of the conductive interconnection member:
   a first solar cell edge of the first solar cell, a second solar cell edge of the first solar cell, a third solar cell edge of the second solar cell, and a fourth solar cell edge of the second solar cell are arranged sequentially,
   a distance between the first solar cell edge and a front electrode pad of the one or more front electrode pads that is adjacent to the first solar cell edge is defined as D1,
   a distance between the second solar cell edge and a front electrode pad of the one or more front electrode pads that is adjacent to the second solar cell edge is defined as D3,
   a distance between the fourth solar cell edge and a back electrode pad of the one or more back electrode pads that is adjacent to the fourth solar cell edge is defined as D2, a distance between the third solar cell edge and a back electrode pad of the one or more back electrode pads that is adjacent to the third solar cell edge is defined as D4, and wherein a sum of D1 and D2 is greater than a sum of D3 and D4.

2. The photovoltaic module according to claim 1, wherein one of the first solar cell edge or the second solar cell edge is a chamfered edge having a chamfered corner, and wherein one of the third solar cell edge or the fourth solar cell edge is a chamfered edge having a chamfered corner.

3. The photovoltaic module according to claim 1, wherein a ratio of the sum of D1 and D2 to the sum of D3 and D4 is greater than 1 and less than 2.5.

4. The photovoltaic module according to claim 3, wherein the ratio of the sum of D1 and D2 to the sum of D3 and D4 is greater than 1 and less than 1.5.

5. The photovoltaic module according to claim 1, wherein the first solar cell is distanced from the second solar cell by a first gap along the extending direction of the conductive interconnection member, wherein the sum of D1 and D2 is greater than a sum of D3, D4, and a length of the first gap.

6. The photovoltaic module according to claim 5, wherein the length of the first gap ranges from 0.5 mm to 5 mm.

7. The photovoltaic module according to claim 1, wherein the electrode structure further comprises:

a plurality of front fingers arranged in parallel on the first surface and electrically connected to the plurality of front electrode pads; and a plurality of back fingers arranged in parallel on the second surface and electrically connected to the plurality of back electrode pads, wherein two adjacent front fingers are distanced from one another by a second gap, and two adjacent back fingers are distanced from one another by a third gap, and wherein:

D1 is greater than 2 times a length of the second gap and less than 11 times the length of the second gap;

D3 is greater than 2 times the length of second gap and less than 11 times the length of the second gap;

D2 is greater than 2 times a length of the third gap and less than 11 times the length of the third gap; and/or D4 is greater than 2 times the length of the third gap and less than 11 times the length of the third gap.

8. The photovoltaic module according to claim 1, wherein:

D1 ranges from 2 mm to 15 mm;
D2 ranges from 2 mm to 15 mm;
D3 ranges from 2 mm to 15 mm; and/or
D4 ranges from 2 mm to 15 mm.

9. The photovoltaic module according to claim 1, wherein D1 is greater than D3.

10. The photovoltaic module according to claim 9, wherein a difference between D1 and D3 ranges from 1 mm to 10 mm, and wherein the electrode structure further comprises:

a plurality of front fingers arranged in parallel on the first surface and electrically connected to the plurality of front electrode pads, wherein two adjacent front fingers are distanced from one another by a second gap, wherein the difference between D1 and D3 is greater than a length of the second gap and less than 6 times the length of the second gap.

11. The photovoltaic module according to claim 1, wherein D2 is greater than D4.

12. The photovoltaic module according to claim 11, wherein a difference between D2 and D4 ranges from 0.5 mm to 10 mm, and wherein the electrode structure further comprises:

a plurality of back fingers arranged in parallel on the second surface and electrically connected to the plurality of back electrode pads, wherein two adjacent back fingers are distanced from one another by a third gap, and the difference between D2 and D4 is greater than a length of the third gap and less than 6 times the length of the third gap.

13. The photovoltaic module according to claim 1, wherein, along the extending direction of the conductive interconnection member:

a distance between a start bonding point of the conductive interconnection member and the first solar cell edge is defined as D5, a distance between an end bonding point of the conductive interconnection member and the fourth solar cell edge is defined as D6, and wherein D5 is not equal to D6.

14. The photovoltaic module according to claim 13, wherein D5 is greater than D6.

15. The photovoltaic module according to claim 1, wherein the electrode structure further comprises:

a plurality of front fingers arranged in parallel on the first surface and electrically connected to the plurality of front electrode pads; and a plurality of back fingers arranged in parallel on the second surface and electrically connected to the plurality of back electrode pads, wherein two adjacent front fingers are distanced from one another by a second gap, and two adjacent back fingers are distanced from one another by a third gap, and wherein:

D5 is greater than a length of the second gap and less than 11 times the length of the second gap;

D6 is greater than a length of the third gap and less than 11 times the length of the third gap;

D5 ranges from 0.5 mm to 15 mm; and/or

D6 ranges from 0.5 mm to 15 mm.

16. The photovoltaic module according to claim 1, wherein, along the extending direction of the conductive interconnection member:

a distance between a start bonding point of the conductive interconnection member and the front electrode pad of the one or more front electrode pads that is adjacent to the first solar cell edge is defined as D7; and a distance between an end bonding point of the conductive interconnection member and the back electrode pad of the one or more back electrode pads that is adjacent to the fourth solar cell edge is defined as D8, and wherein D7 is not equal to D8.

17. The photovoltaic module according to claim 16, wherein D7 is less than D8.

18. The photovoltaic module according to claim 16, wherein the electrode structure further comprises:

a plurality of front fingers arranged in parallel on the first surface and electrically connected to the plurality of front electrode pads; and a plurality of back fingers arranged in parallel on the second surface and electrically connected to the plurality of back electrode pads, wherein two adjacent front fingers are distanced from one another by a second gap, and two adjacent back fingers are distanced from one another by a third gap, wherein:
D7 is greater than a length of the second gap and less than 5 times the length of the second gap;
D8 is greater than a length of the third gap and less than 5 times the length of the third gap;
D7 is less than or equal to 15 mm; and/or
D8 is less than or equal to 15 mm.

19. The photovoltaic module according to claim 1, wherein the first solar cell is distanced from the second solar cell by a first gap along the extending direction of the conductive interconnection member, and
wherein the sum of D3 and D4 is greater than 1.5 times a length of the first gap and less than 20 times the length of the first gap.

20. The photovoltaic module according to claim 1, wherein:
a length of the solar cell body is greater than or equal to a width of the solar cell body, wherein the first solar cell edge intersects with a direction of the width of the solar cell body;
the plurality of front electrode pads are arranged in a first array having 6 to 8 columns and 15 to 20 rows, wherein the first solar cell edge intersects with a direction of rows of the first array, and the plurality of back electrode pads are arranged in a second array having 6 to 8 columns and 15 to 20 rows, wherein the first solar cell edge intersects with a direction of rows of the second array; and/or a front electrode comprises a first inner surface facing the first surface and a first outer surface facing away from the first surface, wherein an area of the first outer surface ranges from 0.01 $mm^2$ to 250000 $mm^2$; and the back electrode comprises a second inner surface facing the second surface and a second outer surface facing away from the second surface, wherein an area of the second outer surface ranges from 0.01 $mm^2$ to 640000 $mm^2$.

21. The photovoltaic module according to claim 1, wherein:
a width of the solar cell body of the first solar cell is equal to a width of the solar cell body of the second solar cell.

* * * * *